(12) United States Patent
Murphy

(10) Patent No.: US 6,329,851 B1
(45) Date of Patent: Dec. 11, 2001

(54) POWER-ON RESET CELL

(75) Inventor: Christopher C. Murphy, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/550,679

(22) Filed: Apr. 17, 2000

(51) Int. Cl.[7] ............................................. H03L 7/00
(52) U.S. Cl. ................................... 327/143; 327/198
(58) Field of Search ................................... 329/143, 198

(56) References Cited

U.S. PATENT DOCUMENTS

| | | | | |
|---|---|---|---|---|
| 5,408,145 | * | 4/1995 | Nguyen | 326/121 |
| 5,734,281 | * | 3/1998 | Morishima et al. | 327/143 |
| 6,118,315 | * | 9/2000 | Guedj | 327/143 |
| 6,204,701 | * | 3/2001 | Tsay et al. | 327/143 |

* cited by examiner

Primary Examiner—Terry D. Cunningham
Assistant Examiner—Quan Tra

(57) ABSTRACT

A power on reset cell is disclosed capable of accommodating faster power cycling rates and providing better trip point control. When the input supply voltage ramps up, the output of the power on reset cell transitions when the input is greater than a predetermined value. The power on reset cell includes a discharge circuit that is capable of discharging a subcircuit of the power on reset cell when the input supply voltage ramps down so that the output of the power on reset cell is prevented from prematurely transitioning during a subsequent ramping up of the input due to any latent charge accumulated in the prior ramping up cycle. The discharge circuit allows the power on reset cell to undergo faster power cycling without providing an invalid output. Furthermore, the discharge circuit provides better control of the output trip point. It is emphasized that this abstract is provided to comply with the rules requiring an abstract that will allow a searcher or other researcher to quickly ascertain the subject matter of the technical disclosure. It is submitted with the understanding that it will not be used to interpret or limit the scope or meaning of the claims. 37 CFR 1.72(b).

5 Claims, 3 Drawing Sheets

POWER-ON RESET CELL

BACKGROUND

A power-on-reset (POR) cell is a circuit that outputs a logical "1" (asserted high) when the supply voltage, the input to the POR, has reached a sufficient, valid level.

When the supply is at 0 V, the POR will output a logical "0" (asserted low). The output switches to a "1" when the supply voltage reaches a predetermined voltage level, usually 2.5 V or greater for a 3 V library. A POR cell is useful because many circuits require the application of a master reset signal only after the supply voltage reaches a valid level. When the supply voltage reaches a valid level, the master reset signal starts all clocks and states storage elements of a system so that proper operation can begin.

Present POR designs have inherent disadvantages that are evident during power cycling. Power cycling involves turning the supply on and off repeatedly, for example while remaining for as little as 1 µs in each state (on or off). Power cycling can occur when a power supply is first plugged in and turned on. It can also occur due to system glitches resulting from noise or mechanical system issues. Power cycling is common in data storage devices such as hard disk drives and tape drives, and also may occur with a poor board design. During power cycling events, as the supply voltage drops to 0 V, some of the subcircuits of the POR will not necessarily discharge all the way to 0 V along with the supply voltage, i.e., there is a discharge lag time existing as a latent voltage in a subcircuit of the POR. The power cycling problem becomes worse as the supply voltage drops more rapidly, in which case it could drop much faster than the rate at which portions of the POR subcircuits are able to discharge. When the supply voltage begins to ramp up again, the POR will output a logical "1" before the supply voltage has reached a valid level due to the latent voltage that was unable to completely discharge during the ramping down of the supply voltage in the previous cycle. This problem will become worse with increasing values of the latent voltage, and the latent voltage will remain at higher levels in proportion to the frequency of the power cycle. In such instances, the output of the POR will be asserted high even when the input supply voltage is at a very low value, for example 0.7 V, and at some point the output of the POR will never go to zero. Another disadvantage of present POR designs is that the low trip point, the falling threshold input voltage at which the output will trip low, is not well controlled. As the supply voltage drops, the point at which the POR output switches from a "1" to a "0" is determined by a number of factors. First, the output will trip to a "0" whenever the latent voltage drops below a switch point of a subcircuit of the POR, generally one half the value of the input supply voltage. But the low trip point is additionally dependent upon the rate at which the input supply voltage falls. The faster the input supply voltage falls, the lower the value of the input supply voltage will be before the output trips. In extreme faster cases, the output may actually go low largely because it is tracking the supply, which is collapsing at such a fast rate. Thus, there lies a need for a power on reset cell that provides improved power cycling performance and trip point control.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiment of the invention, an example of which is illustrated in the accompanying drawings.

Figure 1:
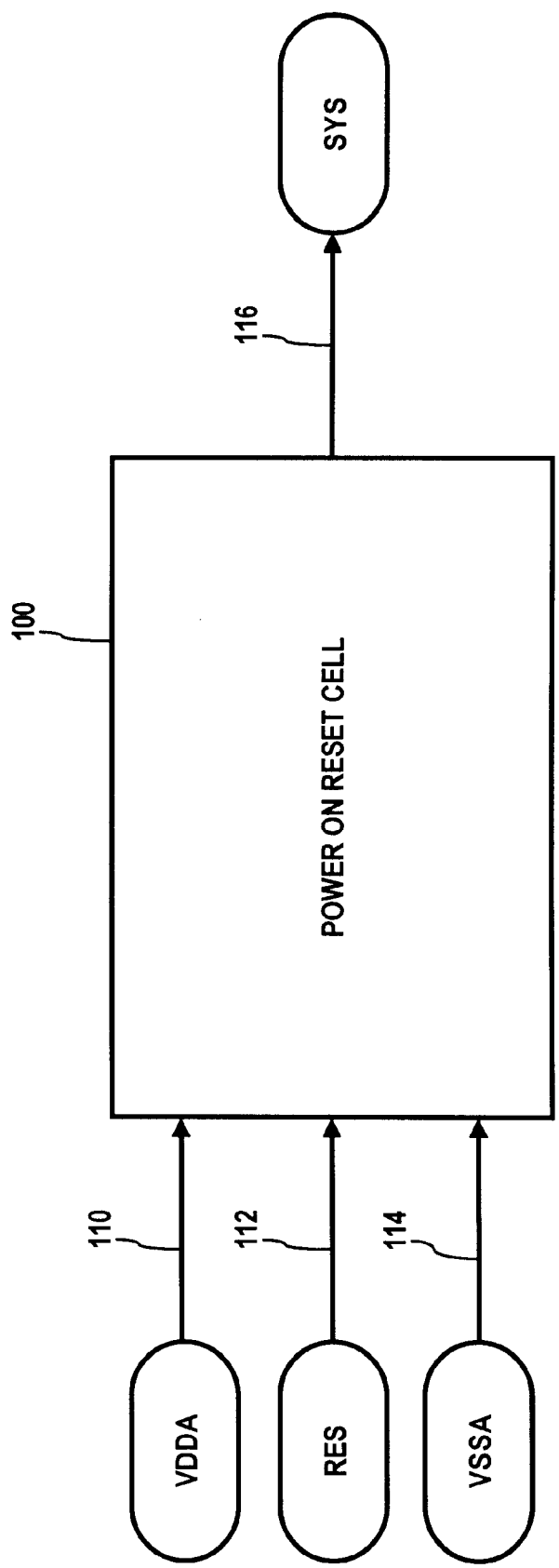
FIG. 1 is a block diagram of a power on reset cell in accordance with the present invention.

Referring now to FIG. 1, a general-purpose power on reset cell POR 100 in accordance with the present invention will be discussed. The drain supply voltage VDDA 110 is the input of POR 100 (in the case where field-effect transistors are utilized), and SYS 116 is the output thereof. RES 112 is a reset signal and allows for manual control of SYS 116. Thus, POR 100 receives power from system voltages VDDA 110 and VSSA 114, and provides a SYS 116 output to the system in which POR is utilized. The value of VDDA 110 with respect to VSSA is the input signal to POR 100 such that SYS 116 output indicates when VDDA 110 has reached a predetermined level by providing a digital output signal that conveys such information. For example, when VDDA 110 is below a predetermined level, SYS 116 provides a logical "0", and when VDDA is equal to or greater than a predetermined level, SYS 116 provides a logical "1". RES 112 is provided as an input to POR 100 for resetting the state of POR 100 without requiring powering down.

Figure 2:
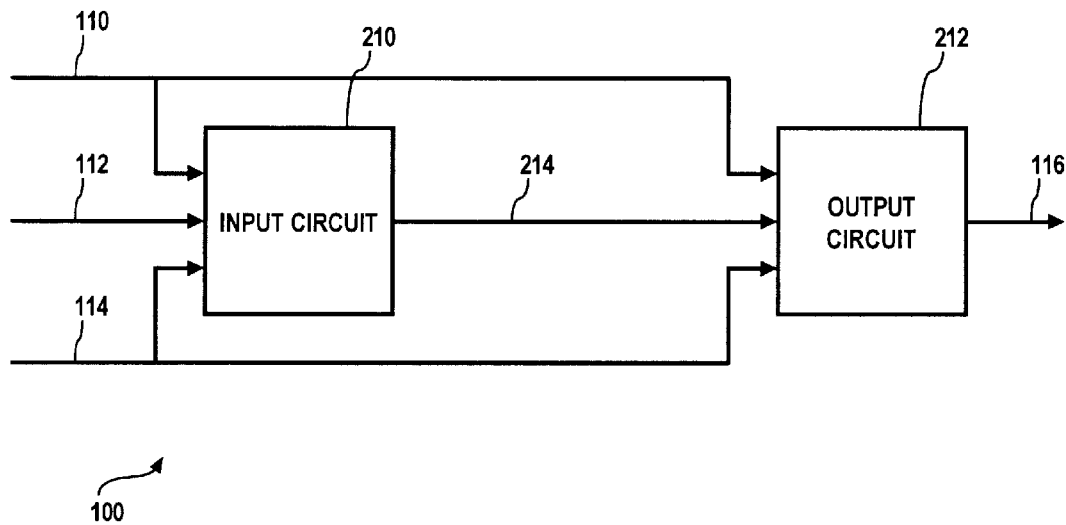
FIG. 2 is a block diagram of a power on reset cell in accordance with the present invention showing an input circuit and an output circuit.

Referring now to FIG. 2, a block diagram showing further detail of the power on reset cell of FIG. 1 will be discussed. POR 100 includes an input circuit 210 and an output circuit 212. Input circuit 210 receives VDDA 110, RES 112, and VSSA 114 of POR 100. Output circuit 212 also receives VDDA 110 and VSSA 114. In addition, input circuit 210 provides an output signal 214 to output circuit in response to inputs 110, 112, and 114. In general-purpose operation of POR 100, VDDA 110 is considered the input, and SYS 116 the output. RES 112 is reset and allows for manual control of SYS 116. Input circuit includes a diode stack (not shown) that sets the high trip level for POR 100. The diode stack may comprise series connected diodes, for example two diodes, or may comprise series connected transistors each configured to operate in a diode connection. Each diode or diode-connected transistor has a threshold voltage (forward-bias voltage drop) of Vt. When VDDA 110 is 0 V and begins to ramp up and reaches a value of twice Vt, each diode will be forward biased and thus will be on. An additional transistor (not shown) in input circuit 210 is coupled to the diode stack and will be charged to the current level of VDDA 110 through the diode stack and will pull down to one Vt through the diode stack, in effect seeing a 3 Vt diode stack. This 3 Vt diode-stack, as it is called, controls what the high trip point is for POR 100, where the high trip point is the level VDDA 110 must rise to before SYS 116 provides a logical "1" output.

VDDA 110 will continue to rise above 2 Vt and approaches 3 Vt, at which time a output signal 214 of input circuit 210, which has been 0 V, begins charging up because the active resistor coupled to the diode stack is now turned on, and through it a transistor configured as a gate capacitor charges up. The ramping up of VDDA 110 continues, and the output signal 214 charges to a level where a first inverter in output circuit 212 regards its input as a logical "1". Output signal 214 will continue charging until the final supply level of VDDA 110 is reached. A feedback transistor coupled from the gate capacitor configured transistor to the diode stack provides some positive feedback as output signal 214 charges up, turning on the feedback transistor pulling down even harder on the additional transistor, which makes output signal 214 charge up even faster. After the first inverter, output circuit 212 includes more inverters, for example three additional inverters, before reaching SYS 116, which is the reset output. An additional feedback transistor coupled from one of the three inverters to the first inverter provides some hysteresis to give the first inverter some noise immunity during switching. Optionally, a weak active resistor configured transistor provides a crude discharge path for the timing node when the VDDA 110 drops. Thus, as VDDA 110 ramps up and reaches a predetermined level, for example at least 2 Vt, the timing node charges up and makes SYS 116 trip high. As VDDA 110 falls and reaches a lower level, SYS 116 will trip low.

Figure 3:
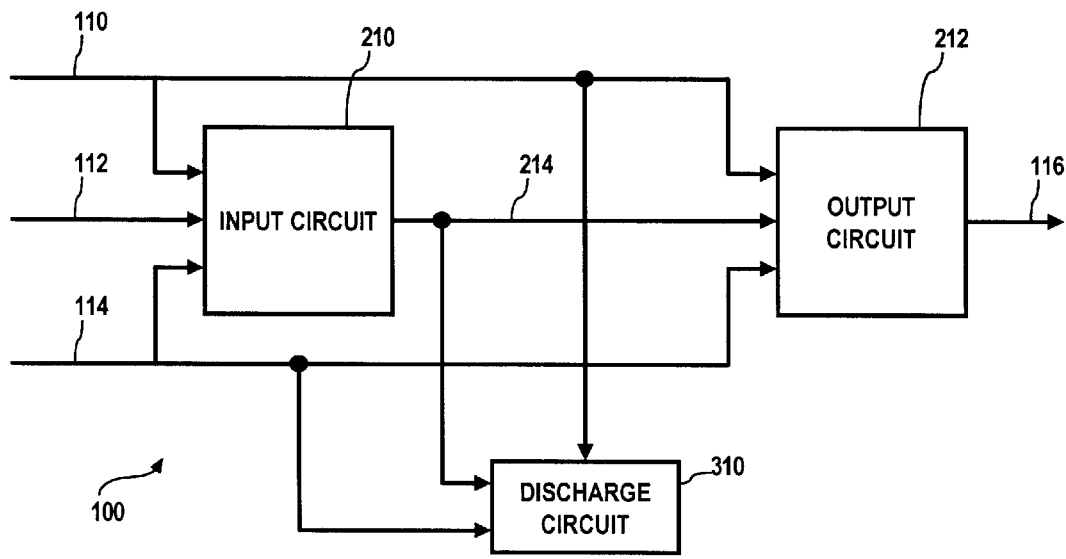
FIG. 3 is a block diagram of a power on reset cell in accordance with the present invention further showing a discharge circuit in accordance with the present invention.

Referring now to FIG. 3, a block diagram of the power on reset cell of FIG. 2, further showing a discharge circuit in accordance with the present invention. Discharge circuit 310 is added to power on reset cell 110 as described in FIGS. 1 and 2 in order to improve the power cycling capability of power on reset cell 100 and the trip point thereof. Discharge circuit 310 receives VDDA 110, VSSA 114, and output 214 of input circuit 210. Discharge circuit 310 is capable of being added to a standard power on reset cell circuit in order to achieve such improved power cycling capability and trip point level control. The details and operation of one embodiment of discharge circuit 310 are discussed with respect to FIG. 4.

Figure 4:
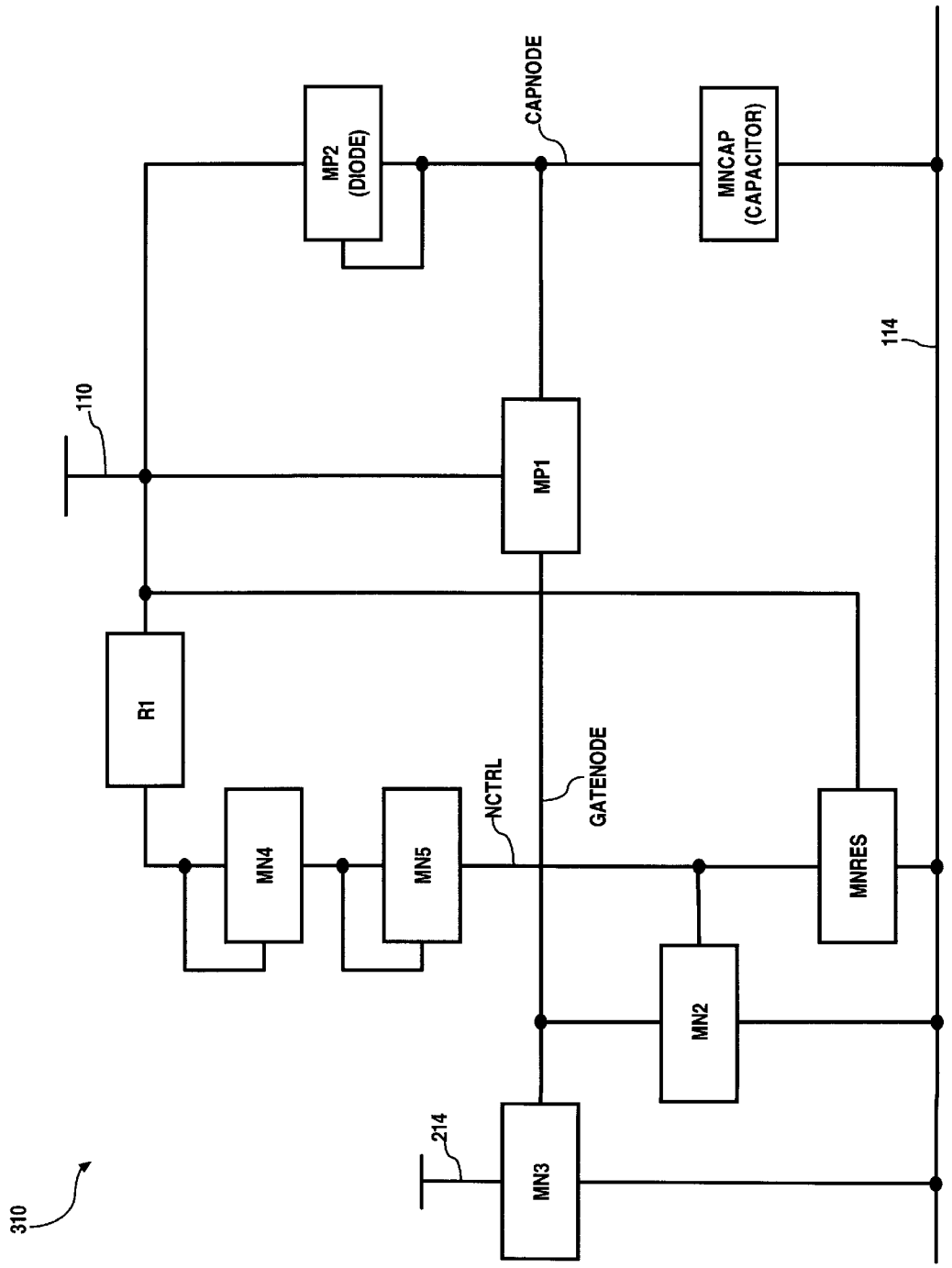
FIG. 4 is a diagram of one embodiment of the discharge circuit of the power on reset cell of FIG. 3 in accordance with the present invention.

Referring now to FIG. 4, a diagram of the discharge circuit 310 shown in FIG. 3 will be discussed. In accordance with the present invention, POR 100 is provided with a faster power cycle ability by discharge circuit 310. Discharge circuit 310 connects to POR 100 through transistor MN3 tied to output signal 214 of input circuit 210. Operation of discharge circuit 310 is as follows. It should be noted that where a transistor is designated by "MN", the transistor may be implemented as an n-MOS transistor, and where a transistor is designated by MP, the transistor may be implemented as a p-MOS transistor. One of skill in the art would recognize that, although particular types of MOSFET transistors are discussed with respect to FIG. 4, other types of transistors (e.g., JFETs, BJTs, etc.) or switching devices (logic gates, latches, etc.) may be utilized in lieu of the circuit shown in FIG. 4, and other similar configurations may be utilized, including using n-channel devices in lieu of p-channel devices, or vice-versa, without departing from the scope and spirit of the present invention and without providing a substantial change thereto. As the supply voltage VDDA 110 ramps up, transistor MP2 becomes a forward-biased diode (i.e., a diode in an active/well p-n junction) and begins to charge up capacitor configured transistor MNCAP. At the same time, transistor RES, configured as an active transistor, turns on and acts as a voltage divider with transistors MN4 and MN5. Transistors MN4 and MN5 (e.g., channel width and length) are sized such that node NCTRL rises to one Vt when the supply voltage VDDA 110 is greater than about 3 V. This pulls node GATENODE to ground (VSSA 114) through transistor MN2. This allows output signal 214 to charge up as discussed with respect to the circuitry of POR 100 of FIG. 2. An additional diode is added to the diode stack of input circuit 210. The additional diode in the diode stack prevents output signal 214 from charging up until more than 3 Vt is reached on VDDA 110. Such an additional diode is optionally utilized when it is desired to set the upper trip point of POR 100 to be higher than 3 Vt.

When the supply voltage VDDA 110 ramps down as POR 100 begins a power cycle, the diode of transistor MP2 becomes reverse biased, and node CAPNODE retains its charge at a value close to the value of the supply voltage VDDA 110. When the supply voltage VDDA 110 continues to drop below the value at node CAPNODE, the voltage at node NCTRL falls below one Vt so that transistor MN2 no longer provides a strong discharge path for node GATENODE. At the same time, the gate of transistor switch MP1 drops one Vt below the voltage at node CAPNODE, sending a burst of charge through to transistor MN3, turning it on and thereby discharging output signal 214. The selection of the physical sizes (e.g., channel width and length) of transistors MN4, MN5, MNRES, and optionally MN2, allows for the setting of the low trip point to be as high as one Vt below the worst-case value of supply voltage VDDA 110. In effect, through application of discharge circuit 310, power-on cycling of POR 100 could continue indefinitely, with as little as 1 µs in each state, and discharge circuit 310 will discharge output signal 214 all the way to ground (VSSA 114). Since discharge circuit 310 forces output signal 214, each occurrence of a ramp up of supply voltage VDDA 110 will never cause SYS 116 to trip prematurely. In one embodiment of the present invention, the original circuitry of POR 100 dictates a higher trip point, and discharge circuit 310 dictates a lower trip point. Through simulation, it has been determined that the lower trip point can vary slightly with the fall time of VDDA 100, and is actually higher for faster edges and slightly lower for slower edges, which is the opposite direction of what would occur in POR 100 without discharge circuit 310. As a result, the present invention provides improved protection against glitches, since glitches tend to be fast edges. The faster power-cycling ability of POR 100 in accordance with the present invention provides more controllable trip points, and lower power consumption, for example 10 µA DC current or less, thereby allowing POR 100 to be utilized, for example, in battery operated devices. Due to the faster response of POR 100 using discharge circuit 100, protection against power spikes in a power supply is provided.

It is believed that the power on reset cell of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
    a power on reset cell comprising an input circuit and an output circuit, the input circuit providing an output signal to the output circuit providing a first output when said input circuit receives an input below a predetermined value, and said output circuit providing a second output when said input circuit receives an input equal to or above the predetermined value; and
    means, receiving as input the output signal of the input circuit, for discharging the output signal of the input circuit such that said output circuit is prevented from prematurely transitioning between the first output and the second output when the input to said input circuit is cycled at a high rate, said discharging means comprising a diode receiving the input to the input circuit, said diode coupled to a capacitor that is charged by said diode, and a first transistor coupled to the input of said input circuit, for controlling the discharge of the output signal by setting a control voltage at a control node, further comprising second and third transistors coupled in series between the input to said input circuit and to said first transistor at the control node, said second and third transistors for further controlling the discharging of the output signal, said second and third transistors having at least one parameter selected to control the discharging of the output signal.

2. An apparatus as claimed in claim 1, further comprising fourth and fifth transistors, said fourth transistor coupled between said capacitor and said fifth transistor, said fifth transistor being coupled to said first transistor at the control node, said fifth resistor having a physical size being selected to set the control voltage at said control node.

3. An apparatus as claimed in claim 2, further comprising a sixth transistor coupled between the control node and the output signal for further controlling the discharging of the output signal.

4. An apparatus as claimed in claim 1, said diode and said capacitor each being implemented by a transistor.

5. A discharge circuit for a power on reset cell, comprising:

a capacitor and means for charging said capacitor in response to an increase in an input to a power on reset cell such that an output of the power on reset cell transitions when the input increases above a first predetermined level;

means for discharging said capacitor when the input of the power on reset cell drops below a second predetermined level; and means for setting the second predetermined level so that an output of the power on reset cell is prevented from prematurely transitioning during a subsequent increase in the input to the power of reset cell, said setting means including a first transistor coupled to the input signal to the power on reset cell and to said discharging means at a control node, and at least a second transistor coupled to said control node, the second predetermined level being set by said setting means at the control node.

* * * * *